(12) United States Patent
Ahn et al.

(10) Patent No.: US 6,515,602 B2
(45) Date of Patent: Feb. 4, 2003

(54) CLAMP CIRCUIT AND METHOD FOR INCREASING DYNAMIC RANGE OF INPUT IMAGE SIGNAL AND MINIMIZING LINE NOISE

(75) Inventors: Gil-cho Ahn, Incheon (KR); Jae-cheun Jung, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/008,498

(22) Filed: Nov. 13, 2001

(65) Prior Publication Data

US 2002/0118127 A1 Aug. 29, 2002

(30) Foreign Application Priority Data

Feb. 28, 2001 (KR) .......................................... 2001-10358

(51) Int. Cl.[7] ................................................ H03M 1/18
(52) U.S. Cl. ....................................................... 341/139
(58) Field of Search ................................. 341/139, 120, 341/118, 155

(56) References Cited

U.S. PATENT DOCUMENTS 5,650,784 A * 7/1997 Hikosaka .................... 341/139
5,757,440 A * 5/1998 Mangelsdorf ............... 341/139

* cited by examiner

Primary Examiner—Brian Young
(74) Attorney, Agent, or Firm—Mills & Onello LLP

(57) ABSTRACT

A clamp circuit and method, which are capable of increasing the dynamic range of an input image signal and minimizing line noise, are provided. A clamp circuit includes a first clamp unit, a variable gain amplifier, a second clamp unit and a clamp controller. The first clamp unit operates under a specific condition, clamps the reference input section of an analog image signal according to at least one first clamp pulse and fixes the DC bias level of the image signal to a predetermined level. The variable gain amplifier (VGA) amplifies the gain of an image signal clamped by the first clamp unit and outputs the signal whose gain is amplified. The second clamp unit operates under conditions which are not the specific conditions, clamps the reference input section of an image signal whose gain is amplified according to at least one second clamp pulse and adjusts the DC bias level. The analog-to-digital converter (ADC) converts either the output of the variable gain amplifier or the image signal clamped by the second clamp unit into a digital signal and outputs the converted signal as predetermined bit digital data. The clamp controller obtains an average value by accumulating the digital data and generates the first clamp pulse and the second clamp pulse by comparing the obtained average value with a target level. According to the present method, it is possible to increase the dynamic range of an input by removing offset showing in a gain amplifier and to minimize line noise which can be shown during the amplification of a gain, using two clamp circuits.

15 Claims, 7 Drawing Sheets

CLAMP CIRCUIT AND METHOD FOR INCREASING DYNAMIC RANGE OF INPUT IMAGE SIGNAL AND MINIMIZING LINE NOISE

BACKGROUND OF THE INVENTION

1. Field of the Invention

The present invention relates to an image processing system, and more particularly, to a clamp circuit and method which are capable of increasing the dynamic range of an input image signal and minimizing line noise.

2. Description of the Related Art

In general, image signals provided by an image signal source such as a video cassette recorder (VCR) or a charge coupled device (CCD) are almost analog signals. A video decoder that receives an analog image signal converts the analog image signal into a digital signal so as to be processed by the digital processor.

In devices that create the analog image signals, the direct current levels of the output image signals vary according to circuit driving methods and characteristics, in many cases. Therefore, when the image signals having different direct current levels are directly connected to a variable gain amplifier or an analog-to-digital converter (ADC) inside the video decoder, the image signals may be severely distorted or may mis-operate. In order to solve this problem, a method of uniformly adjusting the direct current level of the image signal using a clamp circuit has been developed.

Figure 1:
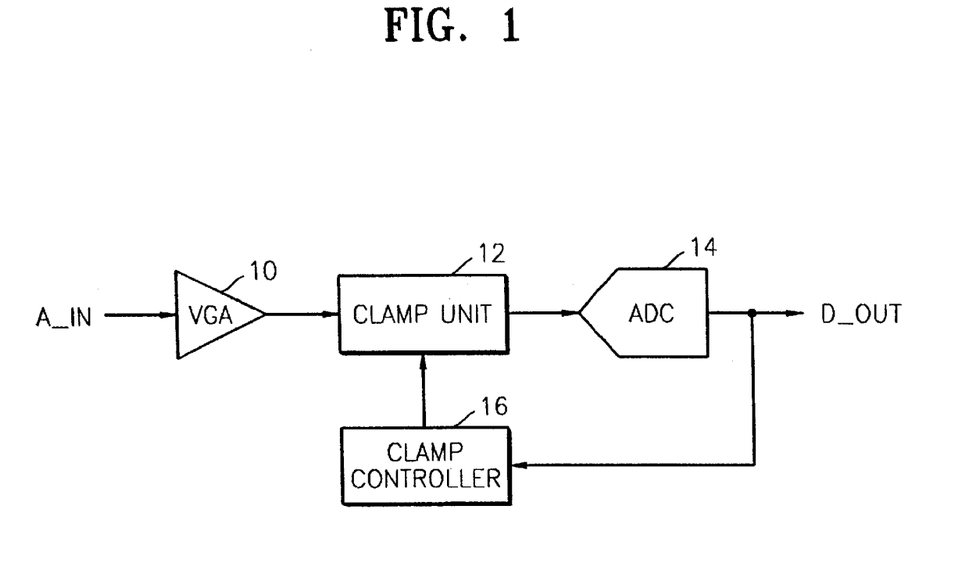
FIG. 1 is a schematic block diagram of a conventional clamp circuit.

FIG. 1 shows a conventional clamp circuit. The clamp circuit includes a variable gain amplifier (VGA) 10, a clamp unit 12, an analog-to-digital converter (ADC) 14, and a clamp controller 16. The VGA 10 amplifies the direct current level of an analog input signal A_IN by a predetermined gain and outputs the amplified signal. The clamp unit 12 clamps the direct current level of the analog signal whose gain is amplified to a predetermined level in response to a clamp pulse output from the clamp controller 16. The ADC 14 converts the clamped analog signal into the digital signal and generates digital data D_OUT. The clamp controller 16 compares the digital data D_OUT output from the ADC 14 with a digital code value that as a reference and generates a control signal for controlling the clamp unit 12 in response to the comparison result.

Since the conventional clamp circuit shown in FIG. 1 performs clamping without removing the offset component generated by the VGA 10, the dynamic range of an input signal can be reduced. However, in the case of an image processing system having a large gain such as a camcorder, clamping must be performed such that the offset that can be generated in an entire image processing path can be removed. Therefore, it is required that the dynamic range of the input signal is set to be wide.

Figure 2:
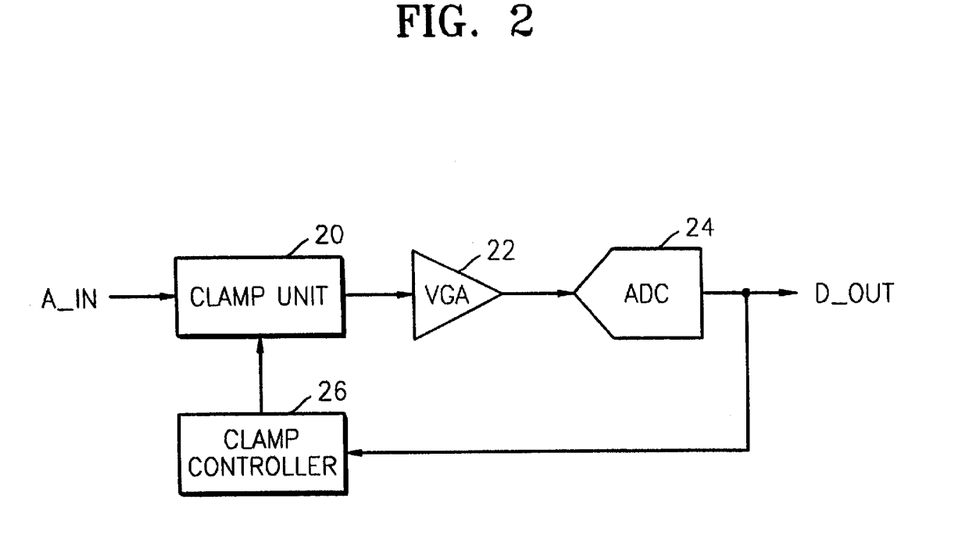
FIG. 2 is schematic block diagram of another conventional clamp circuit.

FIG. 2 shows another circuit illustrating a conventional clamp circuit. The circuit includes a clamp unit 20, a variable gain amplifier (VGA) 22, an ADC 24, and a clamp controller 26. The circuit shown in FIG. 2 is different from the circuit shown in FIG. 1 in that the gain is amplified after the clamp unit 20 clamps the input signal A_IN. In such a case, since the offset shown in the VGA 22 can be removed by the clamp unit 20, the problem in that the dynamic range of the input signal is reduced can be solved. However, even when the level clamped by the clamp unit 20 is small, the clamped level can be amplified by the VGA 22. Therefore, in the case of a video system, in which clamping is performed for every horizontal line, line noise can appear in parts of an image having high gains.

An effective clamping method which is capable of compensating for defects shown in the clamp circuit shown in FIG. 1 and the clamp circuit shown in FIG. 2 is required.

SUMMARY OF THE INVENTION

To solve the above problems, it is an object of the present invention to provide a clamp circuit which is capable of minimizing line noise according to the change in the gain of an image signal and increasing the dynamic range of an input signal.

It is another object of the present invention to provide a clamp method which is performed by the clamp circuit.

The first object is achieved by the clamp circuit having a first clamp unit, a variable gain amplifier, a second clamp unit and a clamp controller. The first clamp unit operates under a first set of conditions, clamps the reference input section of an analog image signal according to at least one first clamp pulse and fixes the DC bias level of the image signal to a predetermined level. The variable gain amplifier (VGA) amplifies the gain of an image signal clamped by the first clamp unit and outputs the signal whose gain is amplified. The second clamp unit operates under a second set of conditions, clamps the reference input section of an image signal whose gain is amplified according to at least one second clamp pulse and adjusts the DC bias level. The analog-to-digital converter (ADC) converts either the output of the variable gain amplifier or the image signal clamped by the second clamp unit into a digital signal and outputs the converted signal as predetermined digital data. The clamp controller obtains an average value by accumulating the digital data and generates the first clamp pulse and the second clamp pulse by comparing the obtained average value with a target level.

In one embodiment, the first clamp unit adjusts a digital code value using the first clamp pulse, converts the digital code value into an analog signal and adjusts the DC bias level using the converted signal. The second clamp unit can adjust the DC bias level by selectively sourcing and sinking predetermined current in accordance with the second clamp pulse. The first clamp pulse can include a first up signal and a first down signal, and the second clamp pulse can include a second up signal and a second down signal. The clamp controller can include a clamp selection circuit, a first clamp pulse generator and a second clamp pulse generator. The clamp selection circuit generates first and second enable signals for selecting the first clamp unit and the second clamp unit in response to a start signal applied under the first set of conditions and a horizontal synchronization signal. The first clamp pulse generator accumulates the digital data in response to the first enable signal, the horizontal synchronization signal and a predetermined clock signal. The first clamp pulse generator obtains the average value of the accumulated data, compares the average value with a first target level and outputs the comparison result as the first up signal or the first down signal. The second clamp pulse generator accumulates the digital data in response to the second enable signal, the horizontal synchronization signal and the clock signal. The second clamp pulse generator obtains the average value of the accumulated data, compares the average value with a second target level and outputs the comparison result as the second up signal or the second down signal.

In one embodiment, one of the first set of conditions is that supplied voltage is applied at an initial stage. One of the first set of conditions can also be that the gain of the input image signal is adjusted.

In one embodiment, each of the first and second clamp pulse generators includes an accumulator, a comparator and an up/down signal generator. The accumulator accumulates the digital data of the reference input section in response to a predetermined accumulation clock signal, obtains the average value of the accumulated data and outputs the obtained average value. The comparator compares the average value with one of the first and second target levels and outputs the comparison result. The up/down signal generator outputs the output value of the comparator as one of the first/second up signal and the first/second down signal in response to a predetermined comparison clock signal. The accumulator can include a first latch, an adder and a second latch. The first latch latches the digital data output from the ADC in response to a reset signal and the accumulation clock signal and outputs the latched data. The adder adds data output from the first latch to a previous digital data value and outputs the addition result. The second latch latches the output signal of the adder in response to the reset signal and the accumulation clock signal and outputs the latched data. The up/down signal generator can include a latch and an up/down controller. The latch latches the output signal of the comparator in response to the comparison clock signal and outputs the latched signal. The up/down controller outputs one of the up signal and the down signal in response to the output signal of the latch.

In accordance with the invention, a method of clamping the DC bias level of an externally applied analog image signal to a predetermined level is also provided. In accordance with the method, it is determined whether a signal showing specific conditions is applied. The average value of digital converted image data of the reference input signal section is compared with a first target level for a first predetermined time and the DC bias level of the reference input signal section is fixed to a predetermined level. The gain of the image signal whose bias level is fixed is amplified. The average value of the digital converted image data of the reference input signal section is compared with a second target level for a second predetermined time, and the DC bias level of the reference input signal is adjusted.

One of the predetermined conditions can be that supply voltage is applied at an initial stage. One of the predetermined conditions can also be that the gain of the input image signal is adjusted. In one embodiment, comparing an average value with a first target level includes accumulating the digital converted image data values of the reference input signal section for the first predetermined time and calculating the average value of the accumulated values; comparing the calculated average value with a first target level and generating a first up/down signal in response to the comparison result; and fixing the DC bias level of the reference input signal section to a predetermined level using the first up/down signal.

In one embodiment, comparing the average value of the digital converted image data with a second target level includes accumulating the digital converted image data values of the reference input signal section for the second predetermined time and calculating the average value of the accumulated values; comparing the calculated average value with a second target level and generating a second up/down signal in response to the comparison result; and adjusting the DC bias level of the reference input signal section using the second up/down signal.

BRIEF DESCRIPTION OF THE DRAWING(S)

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS

Hereinafter, clamp circuit and method which are capable of increasing the dynamic range of an input image signal and minimizing line noise according to the present invention will be described with reference to the attached drawings.

Figure 3:
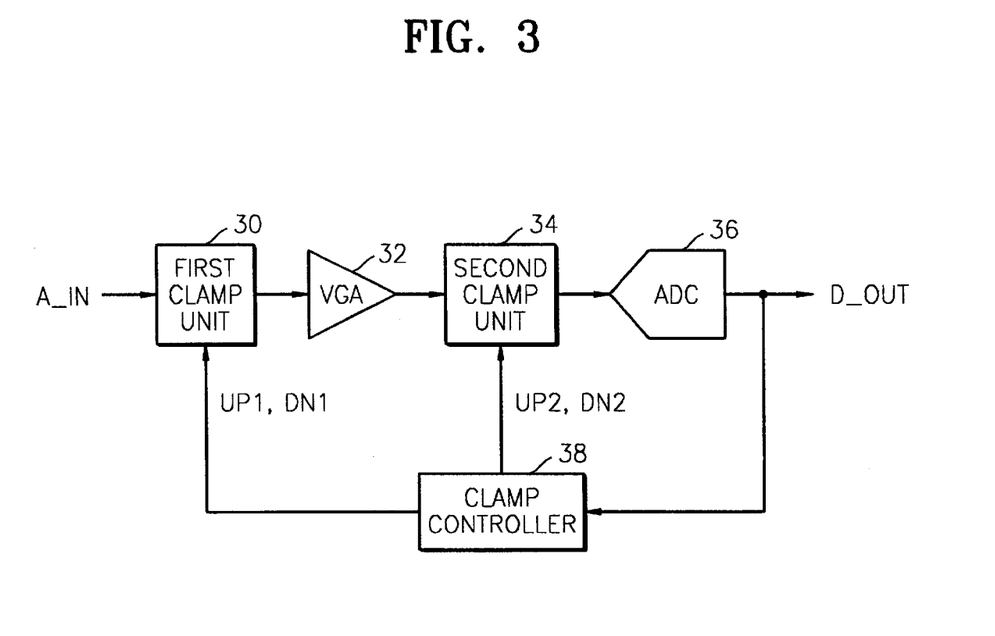
FIG. 3 is a schematic block diagram of a clamping circuit according to an embodiment of the present invention.

FIG. 3 is a schematic block diagram of a clamp circuit according to an embodiment of the present invention. Referring to FIG. 3, the clamp circuit includes a first clamp unit 30, a variable gain amplifier (VGA) 32, a second clamp unit 34, an ADC 36, and a clamp controller 38.

The first clamp unit 30 operates under specific conditions including a case where power is applied at an initial stage or a case where the gain of an image signal is adjusted. The first clamp unit 30 clamps a reference input signal section of an analog image signal by one or more first clamp pulses and fixes the direct current bias level of the image signal to a predetermined level, for a predetermined time that satisfies specific conditions. Here, the clamp pulse can be a first up signal UP1 and a first down signal DN1, which are generated by the clamp controller 38. The first clamp unit 30 can remove the offset shown by the VGA 32 at an initial stage. The first clamp unit 30 is used as only a signal transmission path when the first clamp unit 30 does not operate.

The VGA 32 amplifies the gain of the image signal clamped by the first clamp unit 30, whose direct current bias level is fixed and outputs the signal whose gain is amplified.

The second clamp unit 34 operates for a predetermined time until specific conditions are given again after the operation of the first clamp unit 30 is terminated. At this time, the first clamp unit 30 does not operate. That is, the second clamp unit 34 adjusts the direct current bias level of a signal Vin2 amplified by the VGA 32 in response to a second clamp pulse in a state where the direct current bias level of the image signal is fixed. The adjusted signal is marked with Vout2. Also, the second clamp pulse can be a second up signal UP2 and a second down signal DN2, which are generated by the clamp controller 38. The second clamp unit 34 reduces line noise that can be shown in an image signal whose gain is amplified. When the second clamp unit 34 does not operate, it is used as only a signal transmission path. The output of the VGA 32 is directly transmitted to the ADC 36.

The ADC 36 converts an image signal Vout2 whose direct current bias level is adjusted by the second clamp unit 34 into a digital signal of a predetermined bit and outputs the converted signal as N bit digital data D_OUT.

The clamp controller 38 internally generates first and second enable signals for enabling the first clamp unit 30 and the second clamp unit 34 and generates a first up/down signal UP1/DN1 for controlling the first clamp unit 30 and a second up/down signal UP2/DN2 for controlling the second clamp unit 34, in response to a plurality of control signals and digital data D_OUT output from the ADC 36.

As mentioned above, the clamp circuit is used for uniformly fixing the direct current level of an image signal when the image signal is transmitted and received between different devices. In an image signal processing system such as a digital camera or a monitor of a personal computer, the average brightness and the color level of an image is fully reproduced by maintaining the reference black level to be uniform using the clamp circuit. If the image signal is not clamped and the reference level is not set, the direct current level of the black level changes according to the change in the image level. Accordingly, correct brightness is not reproduced.

In the present invention, it is possible to remove the offset occurring in a gain amplifier and to minimize line noise with respect to the change in the gain by including gain amplifiers at the input side to which the analog image signal is applied and clamp circuits after the gain amplifier.

Figure 4:
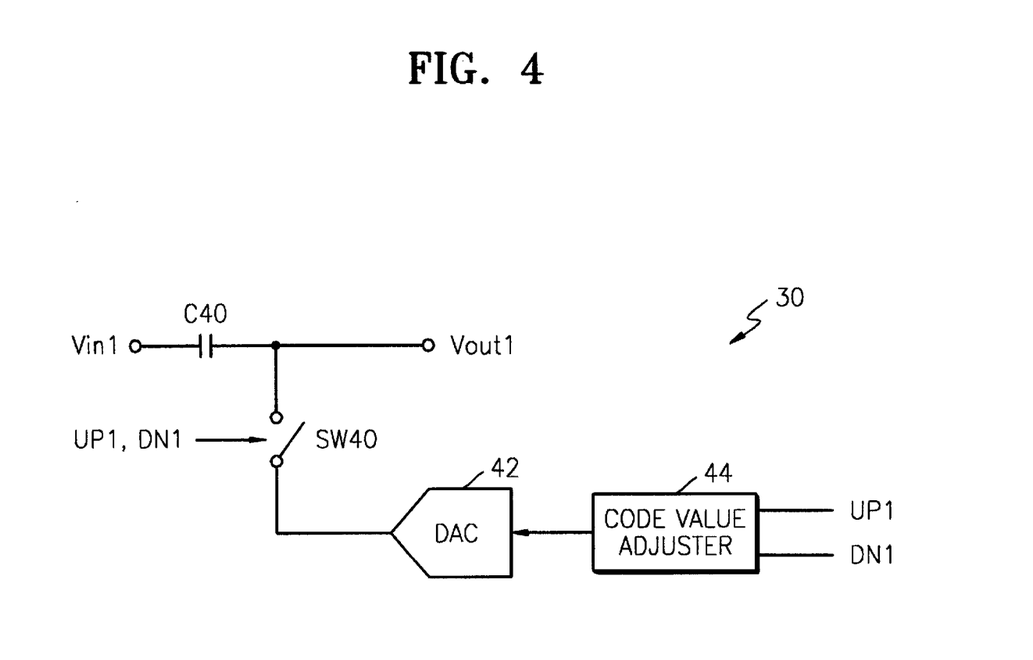
FIG. 4 is a circuit diagram of the first clamp unit of the circuit shown in FIG. 3.

FIG. 4 is a circuit diagram of the first clamp unit 30 of the circuit shown in FIG. 3. The first clamp unit 30 includes a capacitor C40, a switch SW40, a digital-to-analog converter (DAC), and a code value adjuster 44.

Referring to FIG. 4, an alternate current (ac) coupling capacitor C40 is connected between an input image signal Vin1 and an output signal Vout1. Accordingly, the input image signal Vin1 is ac coupled. Here, the input signal Vin1 denotes an analog input signal A_IN.

The code value adjuster 44 adjusts a digital code value for adjusting an input bias level in response to the first up signal UP1 and the first down signal DN1. For example, the code value adjuster 44 can be realized to increase the code value by one in response to the first up signal UP1 and to reduce the code value by one in response to the first down signal DN1.

The digital-to-analog converter DAC 42 converts the digital code value adjusted by the code value adjuster 44 into an analog signal and outputs the converted analog signal. The switch SW40 is on and off in response to the first up signal UP1 and the first down signal DN1 and transmits the analog signal converted by the DAC 42 as the output signal Vout1 in a state where the switch SW40 is turned on.

The first clamp unit 30 shown in FIG. 4, which has the above structure, performs a clamping operation in the reference input section of the analog image signal A_IN under specific conditions such as application of power and adjustment of gain. The code value adjuster 44 is set to have a uniform digital code value at an initial stage. When the first up signal UP1 or the first down signal DN1 is generated, the digital code value is increased or reduced corresponding to the first up signal UP1 or the first down signal DN1.

Accordingly, the direct current bias level of the output signal Vout1 output from the first clamp unit 30 is adjusted. When the direct bias level is fixed to a predetermined level by the change in the digital code value under specific conditions, the output Vout1 is continuously maintained to be uniform and the first clamp unit 30 does not operate.

Figure 5:
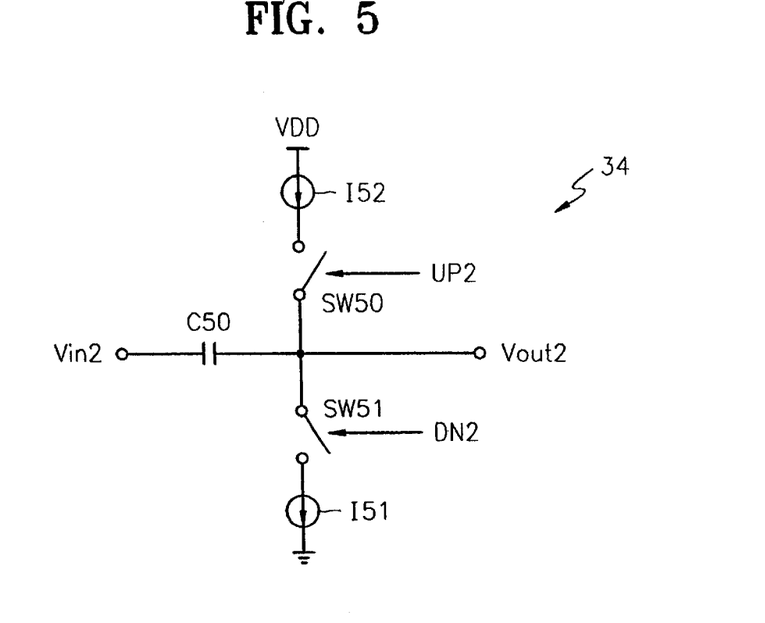
FIG. 5 is a circuit diagram of the second clamp unit of the circuit shown in FIG. 3.

FIG. 5 is a circuit diagram illustrating the second clamp unit 34 of the circuit shown in FIG. 3. The second clamp unit 34 includes a coupling capacitor C50, a first current source 152, a second current source 151, and switches SW50 and SW51.

The coupling capacitor C50 couples an input signal Vin2 by alternating current and outputs the coupled image signal. One side of the first current source 152 is connected to a supply voltage VDD and the other side of the first current source 152 is connected to one side of the switch SW50. The first current source 152 operates as a current source and flows predetermined current corresponding to the current source 152 from the supply voltage VDD. The switch SW50 is turned on and off in response to the second up signal UP2 and forms a current path between the current source 152 and the output voltage Vout2 in a state where the switch SW50 is turned on. When the switch SW50 is turned on, current corresponding to the current source 152 is sourced and the output voltage Vout2 changes. Accordingly, the clamping level is adjusted.

The switch SW51 is turned on and off in response to the second down signal DN2 and forms a current path from the output voltage Vout2 in a state where the switch SW51 is turned on. The second current source 151 operates as a current sink and flows predetermined current to ground VSS in a state where the switch SW51 is turned on.

The second clamp unit 34 shown in FIG. 5 sources and sinks current in response to the second up signal UP2 and the second down signal DN2 and fixes the clamp level to an appropriate level. In FIG. 5, the switches SW50 and SW51 can be turned on when the up signal UP2 or the down signal DN2, which is at the logic "high" level, is applied.

Figure 6:
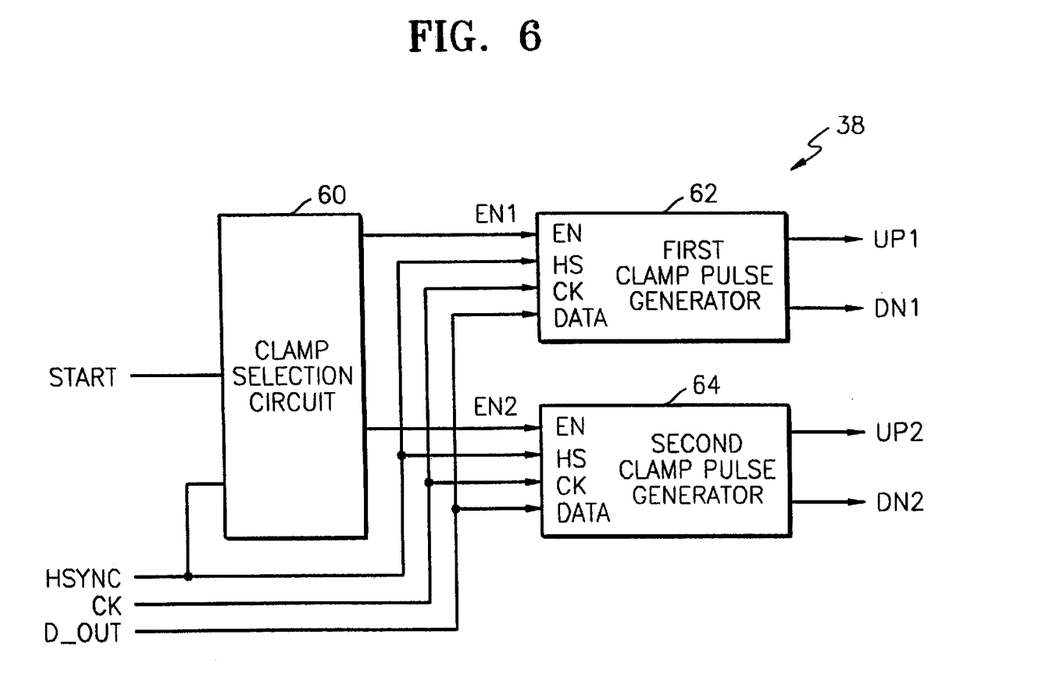
FIG. 6 is a circuit diagram of the clamp controller of the circuit shown in FIG. 3.

FIG. 6 is a block diagram of the clamp controller 38 of the circuit shown in FIG. 3. Referring to FIG. 6, the clamp controller 38 includes a clamp selection circuit 60, a first clamp pulse generator 62, and a second clamp pulse generator 64.

The clamp selection circuit 60 generates first and second enable signals EN1 and EN2 enabled at different points in time in response to a start signal START generated under specific conditions and an externally applied horizontal synchronization signal HSYNC. The start signal START is set in order to operate the first clamp unit 30 under specific conditions. The horizontal synchronization signal HSYNC is applied to the clamp selection circuit 60 and the first and second clamp pulse generators 62 and 64 and informs a reference input signal section, which presents a position where a reference input signal is applied among input image signals. Also, the first enable signal EN1 is enabled during a period in which the first clamp unit 30 operates. Also, the second enable signal EN2 is enabled during a period in which the second clamp unit 34 operates.

The first clamp pulse generator 62 receives the digital data D_OUT output from the ADC 36 (refer to FIG. 3) and generates the first up signal UP1 and the first down signal DN1 in response to the first enable signal EN1, the horizontal synchronization signal HSYNC, and a clock signal CK.

The second clamp pulse generator 64 receives the digital data D_OUT output from the ADC 36 and generates the second up signal UP2 and the second down signal DN2 in response to the second enable signal EN2, the horizontal synchronization signal HSYNC, and the clock signal CK.

Figure 7:
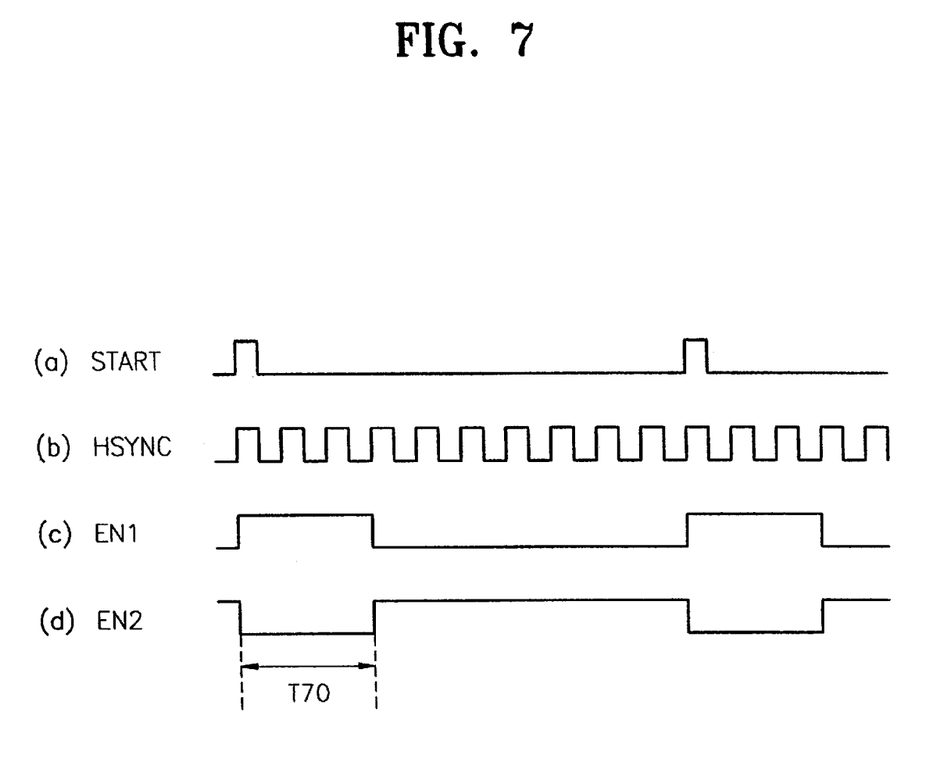
FIG. 7 shows waveforms of the operations of the clamp controller shown in FIG. 6.

FIG. 7 shows waveforms labeled (a) through (d) of the operation of the clamp controller 38 shown in FIG. 6. Waveform (a) shows the start signal START, Waveform (b) shows the horizontal synchronization signal HSYNC, waveform (c) shows the first enable signal EN1, and waveform (d) shows the second enable signal EN2.

The operation of the clamp controller 38 will be described as follows with reference to FIGS. 6 and 7. When the start signal START of waveform (a) is applied, the clamp selection circuit 60 generates the first enable signal EN1 of waveform (c) in order to operate the first clamp unit 30. During a period Tin in which the first enable signal EN1 is activated, the first clamp pulse. generator 62 generates the first up signal UP1 or the first down signal DN1 by the clock signal CK and the digital data D_OUT in the reference input signal section detected in every horizontal synchronization signal HSYNC of waveform (b).

Also, when the first enable signal EN1 is deactivated, the second enable signal EN2 of waveform (d) is activated. At this time, the second clamp pulse generator 64 generates the second up signal UP2 or the second down signal DN2 and operates such that clamping can be performed.

Figure 8:
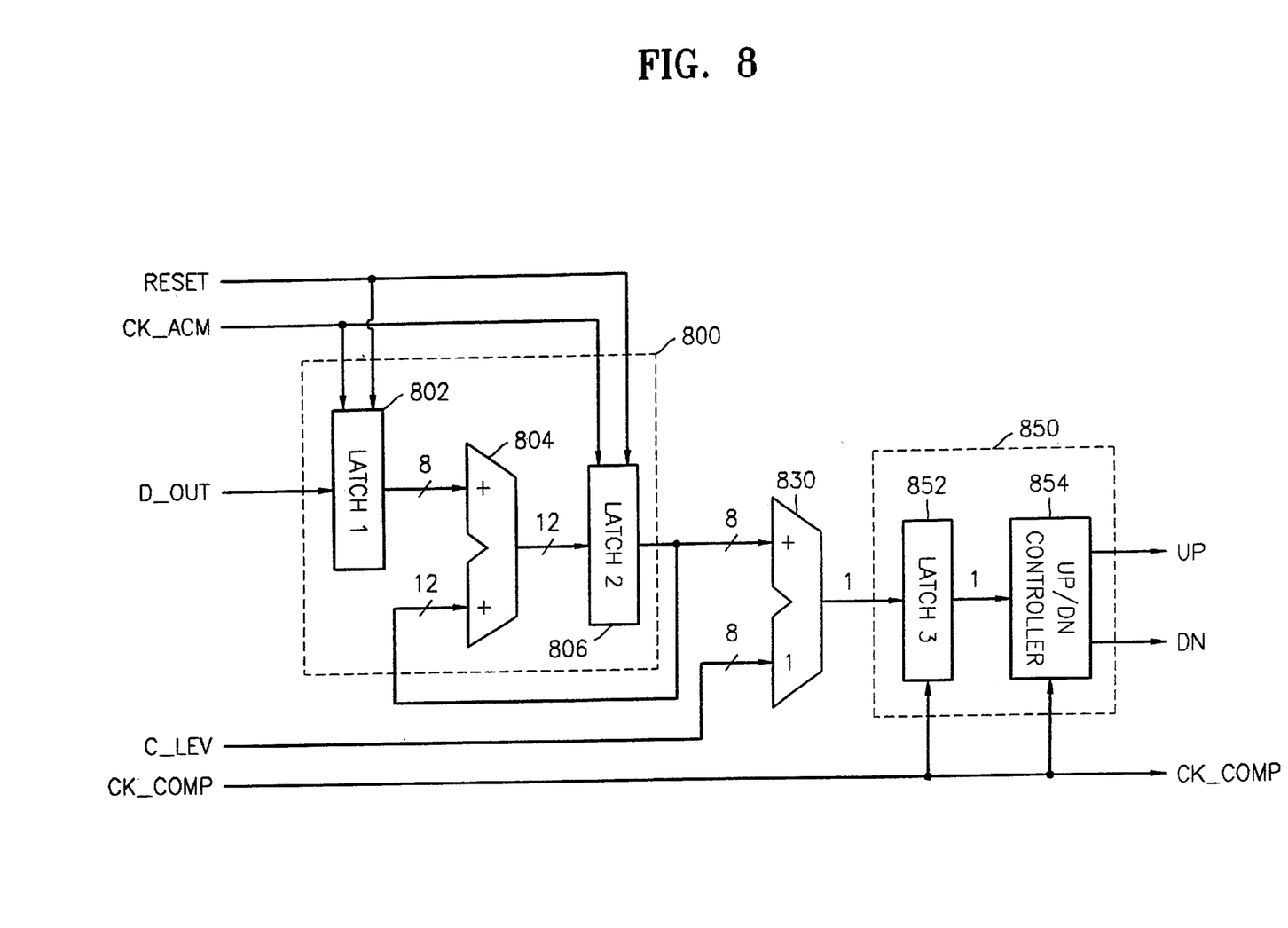
FIG. 8 is a circuit diagram of the first and second clamp pulse generators shown in FIG. 6.

FIG. 8 is a circuit diagram of an embodiment of the first clamp pulse generator 62 and the second clamp pulse generator 64 of the circuit shown in FIG. 6. Referring to FIG. 8, each of the first clamp pulse generator 62 and the second clamp pulse generator 64 includes an accumulator 800, a comparator 830, and an up/down signal generator 850.

The accumulator 800 accumulates digital data of the reference input signal section, which are output from the ADC 36, in response to a predetermined accumulation clock signal CK_ACM, obtains the average value of accumulated data, and outputs the obtained average value. For such an operation, the accumulator 800 includes a first latch 802, an adder 804, and a second latch 806.

The first latch 802 is reset in response to the reset signal RESET, latches n (for example, 8) bit digital data D_OUT in response to the accumulation clock signal CK_ACM, and outputs the latched signal as predetermined bit width, for example, 8-bit, data. The adder 804 is reset in response to a reset signal RESET, adds the 8-bit data output from the first latch 802 to previous digital data, that is, for example, a 12-bit signal output through the second latch 806, and outputs the addition result as a 12-bit signal. The second latch 806 is reset in response to the reset signal RESET and latches the output from the adder 804 in response to the accumulation clock signal CK ACM. The 12-bit output data output from the second latch 806 is feedback input to the adder 804. Also, lower 4-bit data is abandoned and only the upper 8-bit data is input to the comparator 830. This is the average value calculated with respect to the accumulated value.

The comparator 830 compares the 8-bit data value output from the second latch 806 with a target clamp level C_LEV and outputs the comparison result as a one-bit signal.

The up/down signal generator 850 latches the 1-bit output of the comparator 830 in response to a comparison clock signal CK_COMP and generates an up/down signal UP/DN by determining the sign of the latched data. If the clamp pulse generator of FIG. 8 is the first clamp pulse generator 62, the up signal and the down signal are UP1 and DN1, respectively. In the event that the clamp pulse generator of FIG. 8 is the second clamp pulse generator 64, the up signal and the down signal are UP2 and DN2, respectively. For such an operation, the up/down signal generator 850 includes a third latch 852 and an up/down controller 854. The third latch 852 latches the one-bit signal output from the comparator 830 in response to the comparison clock signal CK_COMP and outputs the latched data. The up/down controller 854 determines the sign of the one-bit output signal output from the third latch 852 and generates the up signal UP or the down signal DN in response to the determination result.

Figure 9:
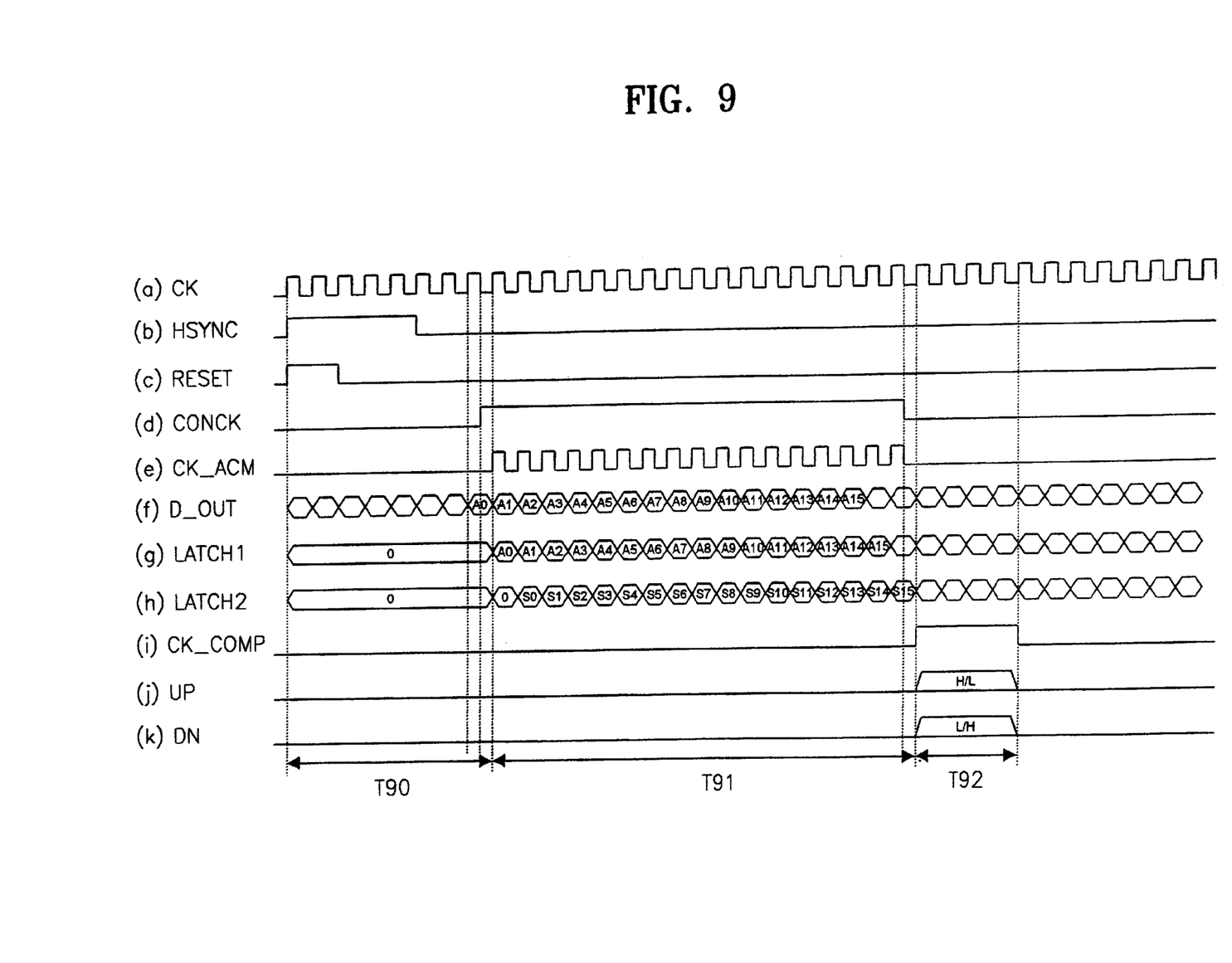
FIG. 9 shows waveforms of the operations of the first and second clamp pulse generators shown in FIG. 8.

FIG. 9 shows waveforms, labeled (a) through (k), of the operations of the first and second clamp pulse generators 62 and 64 shown in FIG. 8. Waveform (a) shows the clock signal CK. Waveform (b) shows the horizontal synchronization signal HSYNC. Waveform (c) shows the reset signal RESET. Waveform (d) shows a clock control signal CONCK. Waveform (e) shows the accumulation clock signal CK_ACM. Waveform (f) shows the digital data D_OUT. Waveform (g) shows the output signal of the first latch 802. Waveform (h) shows the output signal of the second latch 806. Waveform (i) shows the comparison clock signal CK_COMP. Also, waveforms (j) and (k) show the up signal UP and the down signal DN, respectively.

Referring to FIGS. 8 and 9, the operations of the first and second clamp pulse generators 62 and 64 are described in detail. For the convenience of description, it is assumed that the first enable signal EN1 is activated and the first clamp unit 30 operates. The first clamp pulse generator 62 receives the horizontal synchronization signal HSYNC of waveform (b) in response to the clock signal CK of waveform (a), on which the operations of the first and second clamp pulse generators are based. Also, the reset signal RESET of waveform (c) is enabled together with the horizontal synchronization signal HSYNC at an initial stage of the operation. When the reset signal RESET is enabled, the first and second latches 802 and 806 of FIG. 8 are reset and initialized. At this time, the accumulation clock signal CK_ACM of waveform (e) is generated by the clock control signal CONCK of waveform (d). The clock control signal CONCK is set to have a high level during a predetermined period after the horizontal synchronization signal HSYNC is generated. That is, the clock control signal CONCK of waveform (d) can be set externally and applied so as to be enabled during a period in which a reference level is applied from the horizontal synchronization signal HSYNC in an image signal (a reference) input period. Therefore, the accumulation clock signal CK_ACM of waveform (e) can be defined as the clock signal CK generated during a period in which the clock control signal CONCK is enabled. When the digital data D_OUT from the ADC 36 of FIG. 1 is applied as shown in waveform (f), the signal output from the first latch 802 of FIG. 8 is synchronized with the accumulation clock signal CK_ACM of waveform (e) and is shown in waveform (g). The output signal of the second latch 806 is shown in waveform (h) by the accumulation clock signal CK_ACM. A period T90 of FIG. 9 can be a delay time from an initial operation until actually accumulated data is output. As shown in FIG. 9, during the reference input signal period, the accumulation clock signal CK_ACM is enabled and the digital data D_OUT is accumulated. T91 denotes a period in which accumulation data is output. An example of a case where the digital data D_OUT is sampled 16 times by the accumulation clock signal CK_ACM while the reference input signal is applied is shows in waveform (h). The average value is obtained by removing lower bits from the respective accumulation data S0 to S15. The comparator 830 compares the 8-bit data of the second latch 820 with the 8-bit target level C_LEV and outputs one-bit data as the comparison result. When the comparison clock signal CK_COMP of waveform (i) is enabled, the third latch 852 and the up/down controller 854 are enabled. Therefore, as shown in waveform (i), during a period in which the comparison clock signal CK_COMP is enabled to a logic "high" level, the up signal UP of waveform (j) or the down signal DN of waveform (k) are generated. When the up signal UP is at the logic "high" level, the down signal DN is at a logic "low" level. When the up signal UP is at the logic "low" level, the down signal DN is at the logic "high" level. A clamp pulse such as the up signal UP or the down signal DN is enabled during a period T92 of FIG. 9. Also, the pulse length of the up signal and the down signal, that is, the width of a logic "high" level period can be adjusted according to system design.

Figure 10:
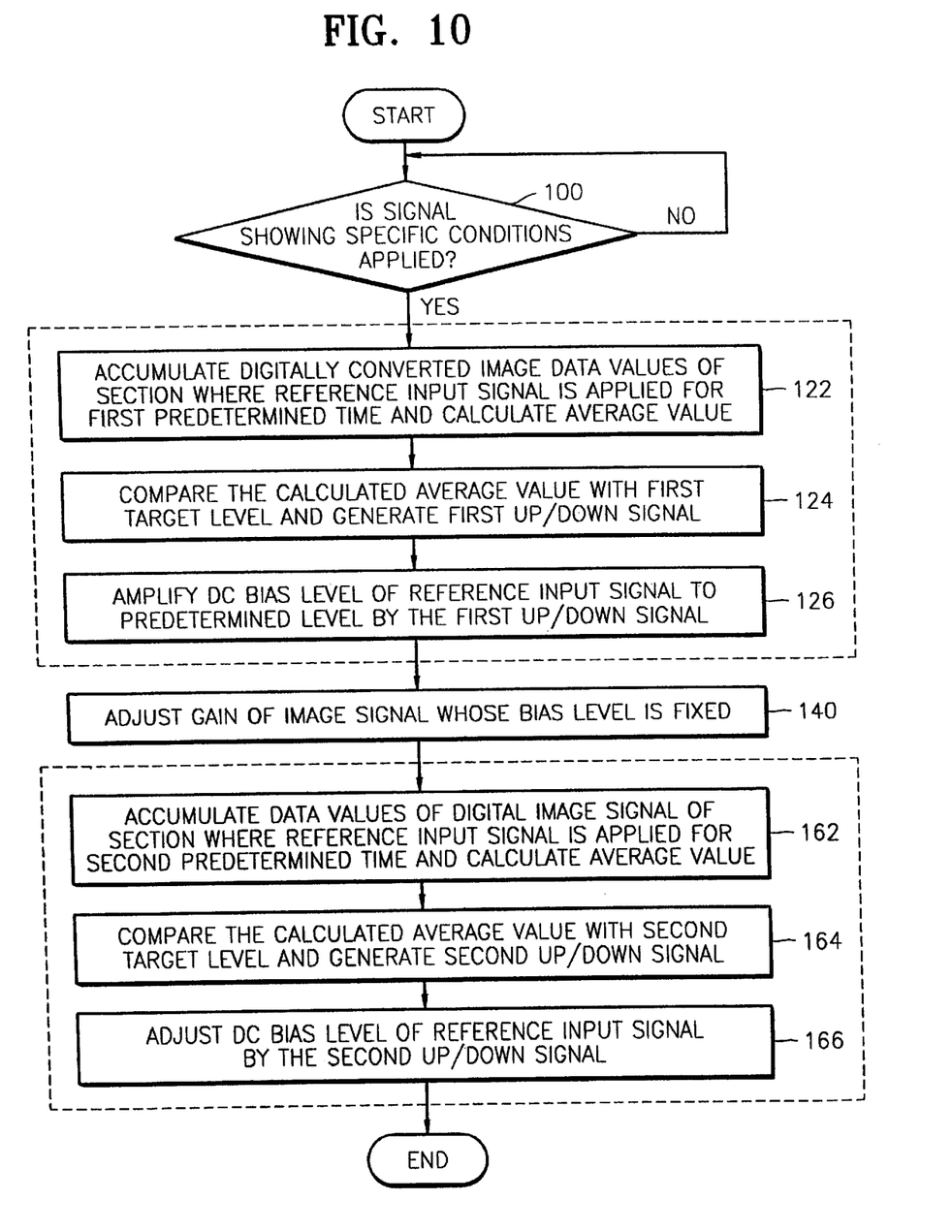
FIG. 10 is a flowchart of a clamp method according to the present invention.

FIG. 10 is a flowchart of a clamp method according to the present invention. The clamp method according to the present invention is described in detail with reference to FIG. 10. It is determined whether a signal which shows specific conditions is applied in step 100. As mentioned above, the specific conditions can be a case where power is applied to a system and a case where the gain of an image signal is adjusted. If the signal which shows the specific conditions is applied in the step 100, the average value of the digital converted image data D_OUT of the reference input signal section is compared with the first target level C_LEV for a first predetermined time and the direct current bias level of the reference input signal is fixed to a predetermined level in step 120. While the first predetermined time, that is, the first enable signal EN1 is activated in step 120, the first clamp pulse generator 62 accumulates the digital converted image data D_OUT values and calculates the average value, in step 122. The calculated average value is compared with the first target level and the first up signal UP1 or the first down signal DN1 is generated in step 124. The first target level can be set to be the center level of the entire range of the input image signal. When the up signal UP1 or the down signal DN1 is generated in step 124, the first clamp unit 30 (refer to FIG. 1) adjusts the direct current (DC) bias level of the reference input signal section by the generated up signal UP1 or down signal DN1 signal and lets the DC bias level fix to a predetermined level, in step 126.

When the level of the reference input signal section is fixed to a predetermined level in the step 120, the first clamp unit 30 does not operate and the gain of the image signal is amplified by the VGA 32 of FIG. 3, in step 140. The signal whose gain is amplified is applied to the second clamp unit 34. The second clamp pulse generator 64 compares the average value of the digital converted image data D-OUT of the reference input signal section with the second target clamp level for a second predetermined time and adjusts the bias level of the reference input signal in step 160. The second clamp pulse generator 64 accumulates the digital data D_OUT values for a second predetermined time, that is, during a period where the second enable signal EN2 is activated, and calculates the average value in step 162. Therefore, the second clamp pulse generator 64 compares the calculated average value with the second target level and generates the second up signal UP2 or the second down signal DN2 in step 164. Here, when the calculated average value is smaller than the second target level, the up signal UP2 is generated. When the average value is larger than the second target level, the down signal DN2 is generated. Therefore, the second clamp unit 34 (refer to FIG. 3) adjusts the DC bias level of the reference input signal in response to the second up signal UP2 or the second down signal DN2, in step 166. For example, when the second up signal UP2 is generated, the second clamp unit 34 operates so as to increase the bias level by sourcing current. When the second down signal DN2 is generated, the second clamp unit 34 operates so as to reduce the bias level during the clamping operation by sinking current.

According to the present invention, it is possible to remove the offset shown in the VGA and reduce line noise according to the change in the gain by separately performing the clamping operation of the image signal before the amplification of the gain and after the amplification of the gain.

While this invention has been particularly shown and described with reference to preferred embodiments thereof, it will be understood by those skilled in the art that various changes in form and details may be made therein without departing from the spirit and scope of the invention as defined by the appended claims.

According to the present invention, it is possible to increase the dynamic range of the input signal by removing the offset shown in the gain amplifier by performing clamping before the amplification of the gain of the image signal using a clamp circuit under the specific conditions and to minimize line noise which can be shown by the amplification of the gain by performing clamping after the gain amplifier using another clamp circuit.

What is claimed is:

1. A clamp circuit, comprising:
   a first clamp unit operating under a set of first conditions for clamping the reference input section of an analog image signal according to at least one first clamp pulse and fixing the DC bias level of the image signal to a predetermined level;
   a variable gain amplifier (VGA) for amplifying the gain of an image signal clamped by the first clamp unit and outputting the signal whose gain is amplified;
   a second clamp unit operating under a second set of conditions for clamping the reference input section of an image signal whose gain is amplified according to at least one second clamp pulse and adjusting the DC bias level;
   an analog-to-digital converter (ADC) for converting one of the output of the variable gain amplifier and the image signal clamped by the second clamp unit into a digital signal and outputting the converted signal as predetermined digital data; and
   a clamp controller for obtaining an average value by accumulating the digital data and generating the first clamp pulse and the second clamp pulse by comparing the obtained average value with a target level.

2. The clamp circuit of claim 1, wherein the first clamp unit adjusts a digital code value using the first clamp pulse, converts the digital code value into an analog signal, and adjusts the DC bias level using the converted signal.

3. The clamp circuit of claim 1, wherein the second clamp unit adjusts the DC bias level by selectively sourcing and sinking predetermined current in accordance with the second clamp pulse.

4. The clamp circuit of claim 1, wherein the first clamp pulse comprises a first up signal and a first down signal and the second clamp pulse comprises a second up signal and a second down signal.

5. The clamp circuit of claim 4, wherein the clamp controller comprises:
   a clamp selection circuit for generating first and second enable signals for selecting the first clamp unit and the second clamp unit in response to a start signal applied under the first set of conditions and a horizontal synchronization signal;

a first clamp pulse generator for accumulating the digital data in response to the first enable signal, the horizontal synchronization signal, and a predetermined clock signal, obtaining the average value of the accumulated data, comparing the average value with a first target level, and outputting the comparison result as one of the first up signal and the first down signal; and a second clamp pulse generator for accumulating the digital data in response to the second enable signal, the horizontal synchronization signal, and the clock signal, obtaining the average value of the accumulated data, comparing the average value with a second target level, and outputting the comparison result as one of the second up signal and the second down signal.

6. The clamp circuit of claim 5, wherein one of the first set of conditions is that supply voltage is applied at an initial stage.

7. The clamp circuit of claim 5, wherein one of the first set of conditions is that the gain of the input image signal is adjusted.

8. The clamp circuit of claim 5, wherein each of the first and second clamp pulse generators comprises:

an accumulator for accumulating the digital data of the reference input section in response to a predetermined accumulation clock signal, obtaining the average value of the accumulated data, and outputting the obtained average value;

a comparator for comparing the average value with one of the first and second target levels and outputting the comparison result; and an up/down signal generator for outputting the output value of the comparator as one of the first/second up signal and the first/second down signal in response to a predetermined comparison clock signal.

9. The clamp circuit of claim 8, wherein the accumulator comprises:

a first latch for latching the digital data output from the ADC in response to a reset signal and the accumulation clock signal and outputting the latched data;

an adder for adding data output from the first latch to a previous digital data value and outputting the addition result; and a second latch for latching the output signal of the adder in response to the reset signal and the accumulation clock signal and outputting the latched data.

10. The clamp circuit of claim 8, wherein the up/down signal generator comprises:

a latch for latching the output signal of the comparator in response to the comparison clock signal and outputting the latched signal; and an up/down controller for outputting one of the up signal and the down signal in response to the output signal of the latch.

11. A method of clamping the DC bias level of an externally applied analog image signal to a predetermined level, comprising:

(a) determining whether a signal showing predetermined conditions is applied;

(b) comparing an average value of digital converted image data of a reference input signal section signal with a first target level for a first predetermined time and fixing the DC bias level of the reference input signal section to a predetermined level;

(c) amplifying the gain of the image signal whose bias level is fixed; and (d) comparing the average value of the digital converted image data of the reference input signal section with a second target level for a second predetermined time and adjusting the DC bias level of the reference input signal.

12. The method of claim 11, wherein one of the predetermined conditions is that supply voltage is applied at an initial stage.

13. The method of claim 11, wherein one of the predetermined conditions is that the gain of the input image signal is adjusted.

14. The method of claim 11, wherein step (b) comprises:

(b1) accumulating the digital converted image data values of the reference input signal section for the first predetermined time and calculating the average value of the accumulated values;

(b2) comparing the calculated average value with a first target level and generating a first up/down signal in response to the comparison result; and (b3) fixing the DC bias level of the reference input signal section to a predetermined level using the first up/down signal.

15. The method of claim 11, wherein step (d) comprises:

(d1) accumulating the digital converted image data values of the reference input signal section for the second predetermined time and calculating the average value of the accumulated values;

(d2) comparing the calculated average value with a second target level and generating a second up/down signal in response to the comparison result; and (d3) adjusting the DC bias level of the reference input signal section using the second up/down signal.

* * * * *